(12) United States Patent
Willard et al.

(10) Patent No.: US 11,935,723 B2
(45) Date of Patent: Mar. 19, 2024

(54) METHOD AND DEVICE FOR PREPARING A MICROSCOPIC SAMPLE FROM A VOLUME SAMPLE

(71) Applicant: Carl Zeiss Microscopy GmbH, Jena (DE)

(72) Inventors: Fabian Perez Willard, Aalen (DE); Tobias Volkenandt, Breisach am Rhein (DE)

(73) Assignee: Carl Zeiss Microscopy GmbH, Jena (DE)

( * ) Notice: Subject to any disclaimer, the term of this patent is extended or adjusted under 35 U.S.C. 154(b) by 50 days.

(21) Appl. No.: 17/522,087

(22) Filed: Nov. 9, 2021

(65) Prior Publication Data
US 2022/0157560 A1 May 19, 2022

(30) Foreign Application Priority Data

Nov. 17, 2020 (DE) .......................... 102020007024.8
Feb. 23, 2021 (DE) .......................... 102021201686.3

(51) Int. Cl.
*H01J 37/31* (2006.01)
*H01J 37/08* (2006.01)

(52) U.S. Cl.
CPC .............. *H01J 37/31* (2013.01); *H01J 37/08* (2013.01); *H01J 2237/2801* (2013.01); *H01J 2237/31749* (2013.01)

(58) Field of Classification Search
CPC ....... H01J 2237/0805; H01J 2237/0807; H01J 2237/2801; H01J 2237/31745;
(Continued)

(56) References Cited

U.S. PATENT DOCUMENTS 7,700,367 B2   4/2010  Fujii
2010/0176296 A1* 7/2010  Kaito .................. H01J 37/3056
                                                          250/307
(Continued)

FOREIGN PATENT DOCUMENTS

DE   10 2012 010 708 A1   12/2013
EP      2 833 125 B1        2/2015
EP      3 116 017 B1        1/2017

OTHER PUBLICATIONS

Titze B., Genoud C.: Volume scanning electron microscopy for imaging biological ultrastructure, Biol. Cell (2016), 106: 307-323.
(Continued)

*Primary Examiner* — David E Smith
*Assistant Examiner* — Hsien C Tsai
(74) *Attorney, Agent, or Firm* — Fish & Richardson P.C.

(57) ABSTRACT

A method prepares a microsample from a volume sample using multiple particle beams. The method includes providing a volume sample in the microscope system, wherein the interior of the volume sample has a sample region of interest, and producing a macrolamella comprising the sample region of interest by removing sample material of the volume sample using one of the particle beams. The method also includes orienting the macrolamella relative to one of the particle beams, and removing sample material of the macrolamella via a beam so that the region of interest is exposed.

20 Claims, 6 Drawing Sheets

(58) Field of Classification Search
CPC .. H01J 2237/31749; H01J 37/08; H01J 37/31; H01J 37/3005; H01J 37/3056; G01N 1/32; G01N 1/286
See application file for complete search history.

(56) References Cited

U.S. PATENT DOCUMENTS

| | | |
|---|---|---|
| 2013/0323937 A1 | 12/2013 | Kuebler |
| 2013/0328246 A1* | 12/2013 | Wells ................. H01J 37/3056 264/485 |
| 2015/0036122 A1 | 2/2015 | Edelmann et al. |
| 2017/0011885 A1 | 1/2017 | Lechner |

OTHER PUBLICATIONS

German Office Action, with translation thereof, for corresponding DE application No. 102021201686.3, dated May 25, 2021.

* cited by examiner

METHOD AND DEVICE FOR PREPARING A MICROSCOPIC SAMPLE FROM A VOLUME SAMPLE

CROSS-REFERENCE TO RELATED APPLICATION

This application claims benefit under 35 U.S.C. § 119 to German Application No. 10 2021 201 686.3, filed Feb. 23, 2021 and German Application No. 10 2020 007 024.8, filed Nov. 17, 2020. The contents of these applications are hereby incorporated by reference in its entirety.

FIELD

The disclosure relates to methods and devices for preparing microscopic samples, also called microsamples hereinafter.

BACKGROUND

Microsamples have dimensions in the sub-millimeter range, i.e. of the order of magnitude of a few micrometers (µm) or nanometers (nm).

These samples are usually examined and/or processed in an electron microscope (scanning electron microscope, SEM, or transmission electron microscope, TEM), an ion microscope or other microscope systems with a similar resolution capability.

Microsamples can be configured in different ways depending on the microscopy method used. The microsample can be a TEM lamella, for example, which can be used for transmission electron microscopy (TEM).

A TEM lamella is understood to mean an electron-microscopic sample which has substantially the shape of a flat parallelepiped. At least in one region the sample parallelepiped is thin enough that electrons can irradiate through it. Electrons that have passed through the TEM lamella (so-called transmitted electrons) can then be detected with a suitable detector and used to generate an image of the sample (a so-called transmission image or a diffraction image).

In order that TEM lamellas contain the sample region of interest (ROI), in general, they are prepared from the full sample material, i.e. from a full sample block. Such a sample block is referred to as volume sample hereinafter.

In order to be able to examine or process a sample region of interest with particle microscopy, the region can be situated at the surface of the sample or in direct proximity to the surface of the sample. It is therefore desirable to correspondingly expose the sample region of interest (ROI), which can be difficult if the ROI is localized deep in the interior of the volume sample. In this case, it can be desirable to remove large amounts of sample material in order to make the ROI accessible for the further preparation. On the other hand, it can be desirable to prevent the ROI from being damaged or even inadvertently removed during the coarse removal of the sample material.

Often it is furthermore desirable for the microsample to be separated from the volume sample and taken away. Various lift-out methods are known for this purpose. Special manipulation or holding tools such as micromanipulators or microgrippers are usually used for the lift-out procedures. Furthermore, transfer processes can involve the risk of the microsample being damaged or lost.

In order to process a volume sample in such a way that the ROI is localized in proximity to the sample surface of the volume sample after processing, various methods have been proposed.

In this regard, the volume sample can be sliced into many serial sections using a microtome, for example, which sections can then be examined individually. This can involve producing very many sections in order to reach a deep sample region, which can be very time-consuming. Moreover, in general, this method is suitable only for relatively soft materials.

It has furthermore been proposed to process the volume sample mechanically, for example by mechanical sawing, grinding and/or polishing. Fine processing to remove small amounts of material can subsequently be carried out using a focused ion beam (FIB).

In this case, the devices (e.g. microtome, grinding or polishing device, scanning electron microscope, light microscope, FIB system) have to be provided. Moreover, it is generally desirable to process the sample in different devices. Therefore, it may be that the sample is transferred back and forth between the devices.

It has additionally been proposed to realize the coarse processing using a laser and the fine processing using a focused ion beam (FIB). In this case, it may be that an ROI localized in the depth of the sample is not reached directly either with the laser beam or with the FIB beam. It can therefore be desirable firstly to remove large sample volumes in a vertical processing direction (depth), which can be quite time-consuming. With the focused ion beam (FIB) it is generally not possible to remove sample material with a large depth extent in an acceptable time. Moreover, removal of material using a laser from top to bottom (so-called top-down, relative to the processing direction) is often inhomogeneous. Furthermore, the target depth of the laser processing may be difficult to control.

Reference is made to the following documents:

Titze B., Genoud C.: Volume scanning electron microscopy for imaging biological ultrastructure, Biol. Cell (2016), 106: 307-323;

EP 3 116 017 B1; and

EP 2 833 125 B1.

SUMMARY

It is generally desirable to provide a method by which a structure hidden deep in a sample block can be made accessible for an FIB-SEM analysis or FIB-SEM preparation relatively rapidly and relatively reliably. Such a deep structure may be localized at a depth, i.e. at a distance from the outer surfaces of the volume sample, of a few tens of micrometers to a few millimeters, for example.

The present disclosure seeks to provide a method which makes it possible, in a short time, to prepare a microsample containing a region of interest (ROI) which had previously been localized in the inaccessible interior of a sample block.

In an aspect, the disclosure provides a method for preparing a microsample from a volume sample. The method is carried out with the aid of a microscope system having a device for generating a first particle beam and a device for generating a second particle beam. The devices are configured to direct the particle beams onto a sample to be processed and to remove sample material using the first particle beam or the second particle beam. The sample to be processed is embodied as volume sample, microsample or as a macrolamella. The method includes: a) providing a volume sample in the microscope system, wherein the interior of the volume sample has a sample region of interest; b) producing a macrolamella including the sample region of interest by removing sample material of the volume sample with the first particle beam, such that a first cross-sectional surface and a second cross-sectional surface are exposed. The first cross-sectional surface and the second cross-sectional surface are arranged opposite one another and both cross-sectional surfaces are spaced apart from one another, such that the sample region of interest is localized between the cross-sectional surfaces; c) orienting the macrolamella relative to one of the particle beams in such a way that the particle beam and one of the cross-sectional surfaces produced in the preceding step form an angle β with respect to one another, wherein the angle β assumes a value in the range of 10° to 90°; and d) removing sample material of the macrolamella via that particle beam which forms the angle β with the cross-sectional surface such that the sample region of interest is exposed.

The present disclosure additionally relates to a microscope system which provides one particle beam or a plurality of particle beams with which a microsample and its precursors (i.e. processing stages) according to the disclosure can be produced, processed and advantageously imaged as well.

In an aspect, the disclosure provides a microscope system for preparing a microsample from a volume sample. The microscope system includes a first device for generating a first particle beam, and also a second device for generating a second particle beam. The devices are configured to direct the particle beams onto a sample to be processed and to remove sample material using the first particle beam or the second particle beam. The sample to be processed is embodied as volume sample, microsample or as a macrolamella. The microscope system has a device for imaging the sample to be processed. The microscope system is configured to perform a method according to the disclosure.

In an aspect, the disclosure provides a computer program product that includes a is sequence of control commands that causes a microscope system to carry out a method according to the disclosure.

During the preparation of samples for particle beam microscopy there is often the difficulty that an ROI is localized deep in the interior of a volume sample.

This is the case if the ROI is arranged at a depth—at a distance from the outer surfaces of the volume sample—of several tens of micrometers or even up to a few millimeters, for example.

Making such an ROI accessible for a fine preparation could involve material removal with considerable depth (several tens of micrometers to a few millimeters) and considerable volume (hundred thousand cubic micrometers or more). To that end, an outer sample layer would be removed before the next sample layer can be removed. Only after that could a further layer underneath be removed, and so on.

In other words, in the case of a deep ROI, it can be desirable to remove a large amount of sample material (for example a few hundred thousand cubic micrometers) arranged in succession in the vertical processing direction (i.e. in the direction of the depth processing). Therefore, a large removal depth (e.g. of one hundred micrometers or more) may not be practicable for sufficiently sensitive removal methods such as, for example, so-called milling using a focused ion beam (FIB). An alternative procedure could involve working toward the ROI from the side. However, in the case of this possibility, too, a very large amount of material could have to be removed, such that removal using the FIB beam is impracticable.

In the disclosure, it has been realized that such an impracticable removal depth can be to converted into a lateral, readily manageable removal length. The microsample preparation can be facilitated and considerably accelerated as a result.

In some embodiments, in a first step a macrolamella is produced from the volume sample. The actual microsample is subsequently prepared from the macrolamella. In other words, the method includes a plurality of processing stages of the sample, specifically: volume sample, macrolamella and microsample.

The removal of sample material during the preparation can be effected in at least two different processing directions.

The material removal can be effected by removing particle beam. The particle beam can be a laser beam (e.g. the beam of a femto-, pico- or nanosecond laser) or a focused ion beam.

The focused ion beam can be a FIB with a liquid metal ion source (LMIS), for example a gallium ion source, or else as a plasma FIB. A plasma FIB usually provides higher beam currents than an LMIS FIB, such that both the coarse processing (removal of volumes of one hundred thousand cubic micrometers or more) and the fine processing (removal of volumes of less than one hundred thousand cubic micrometers) can be effected using a plasma FIB to a certain degree by way of the setting of the beam currents.

However, it is also conceivable for a plurality of the abovementioned types of particle beams to be used in the method according to the disclosure in order to provide coarse processing and fine processing.

The microsample can be a vertical TEM lamella or as a horizontal TEM lamella (also called planar view lamella). Furthermore, the microsample can be cylindrical or conical, for example as a needle sample for (S)TEM tomography or for atom probe examinations, or as a cylindrical microsample for XRM or synchrotron examinations. Furthermore, the microsample can also be a volume for FIB-SEM tomography.

In some embodiments, in order to prepare the microsample, the volume sample is processed such that a macrolamella is produced. The macrolamella includes the ROI. The macrolamella can be produced by removing material of the volume sample in a first processing direction. This can be done in such a way that two cross sections are is produced. The first processing direction runs approximately in the depth direction. The two cross-sectional surfaces that arise in this case can be spaced apart from one another and delimit the macrolamella.

A lamella is generally understood to mean a flat parallel-epiped having the side edges z (length), y (width) and x (thickness). This can apply to a macrolamella as well. In the present case, the distance between the two cross-sectional surfaces corresponds to the thickness x of the macrolamella. In comparison with known TEM lamellas, however, a macrolamella is significantly larger with side edge lengths of up to a few millimeters. By way of example, a macrolamella can have side edge lengths of approximately 350 μm or 400 μm and a thickness of 10 μm.

Generally, according to the disclosure, the macrolamella includes the region of interest (ROI). To that end, it can be desirable to know beforehand the spatial coordinates of the ROI in the volume sample are known, or at least to presume these spatial coordinates.

If the structural construction of the volume sample is known, for example in the case of a semiconductor component, the x,y,z-coordinates of the ROI can be presumed.

It is also possible for CAD data to be used in order to determine the spatial location and spatial orientation in the volume sample. On the other hand, the x,y,z-coordinates of the ROI may have been determined by preceding, nondestructive microscopic examinations, such as e.g. thermography, ultrasound or x-ray methods.

With knowledge of the x,y,z-coordinates of the ROI, the spatial location and the spatial orientation of the macrolamella are then chosen such that the volume of the macrolamella encloses the ROI.

Spatial location is understood to mean the localization of an ROI or of a macrolamella in three-dimensional space, which can be described by specification of the x-, y- and z-coordinates. Spatial orientation is understood to mean the orientation relative to a reference point. The spatial orientation is usually related to one of the optical axes of the microscope system used.

The x,y,z-coordinates can also be related to a sample-specific coordinate system of the volume sample. However, it is also conceivable for the volume sample to be provided in a sample holder system, and for the coordinates to relate to the coordinate system of the sample holder system.

Moreover, it is conceivable for the method to be carried out without the localization of the ROI being known beforehand. In this case, first of all a macrolamella is produced and then only with visual monitoring is an ROI defined which is encompassed by the macrolamella and which is intended to be examined more precisely.

It is furthermore conceivable for a volume sample to include not just one but rather a plurality of sample regions of interest (ROIs). Using the method according to the disclosure, it is thus possible to produce a plurality of macrolamellae from a volume sample. It is likewise possible to obtain a plurality of microsamples (e.g. TEM lamellae) from a macrolamella. This can then yield a multiplicity of examinable regions, for example a multiplicity of electron-transparent windows (TEM lamellae), which can be distributed over a relatively large sample region.

In some embodiments, in the next stage of the method according to the disclosure, the macrolamella is processed in a second processing direction. In this case, it can be desirable for the first and second processing directions to be arranged substantially perpendicularly to one another. The cross-sectional surface just produced can then be processed in the second processing direction. That is to say, therefore, that the macrolamella is processed from the side. It is possible to remove a sample volume which was originally situated at an inaccessible depth. Moreover, that sample volume which was originally manifested as sample layers lying one above another can now be removed laterally. In other words, it is possible for the sample material lying along the original depth axis to no be longer arranged one behind another, but rather next to one another, relative to the second processing direction. The processing depth involved for removing this material generally corresponds only to the thickness $x_M$ of the macrolamella.

It can be desirable to produce cross sections in the first processing direction with the aid of a laser beam. By way of example, a nanosecond, picosecond or femtosecond laser can be used for this purpose. The laser can allow material removal that is order of magnitude faster than the material removal using an FIB beam, with the result that this processing step can proceed considerably faster.

It has proved to be desirable for the different processing stages of the sample (volume sample, macrolamella and microsample) to be observed while the method according to the disclosure is being carried out. This can be done via light-microscopic, electron-microscopic or ion-microscopic imaging. Furthermore, it is conceivable to combine two or more of these imaging methods.

It can be desirable for a method according to the disclosure to be performed via an SEM-FIB combination apparatus with laser. An SEM-FIB combination apparatus is a microscope system which, in addition to a scanning electron microscope (SEM), also includes an ion beam column for generating a focused ion beam (FIB).

Using the SEM function of the combination apparatus, an electron beam can be directed onto the sample. The incident primary electrons can interact with the material of the sample, and so interaction products can be released. The interaction products can be detected using suitable detectors and used for image generation. Depending on the type of detected interaction products, it is possible to generate image representations with different image contrasts. Moreover, the SEM-FIB combination apparatus can include a laser device which makes it possible to direct a laser beam onto the volume sample or the macrolamella. In this regard, it is possible to remove sample material in large volumes (for example a few hundred thousand cubic micrometers) using laser ablation in a short time.

As already mentioned, it has proved to be desirable for the cross sections to be produced using laser ablation. Alternatively, it is conceivable to produce the cross sections using a plasma FIB system in which a plasma ion source is used.

The material removal during the processing in the second processing direction can be effected using a laser or a FIB. To that end, the laser or FIB beam can be incident on the cross-sectional surface to be processed at an angle of 10° to 90°, such as at an angle of 30°, 54° or 90°.

In some embodiments, the macrolamella remains connected to the volume sample during the method. Optionally, the macrolamella can be thinned using a laser or FIB beam before the processing in the second processing direction starts. The thinning reduces the thickness of the macrolamella.

In some embodiments, the macrolamella is separated from the volume sample and transferred to a suitable receptacle device, for example a TEM grid, with the aid of a micromanipulator or gripper. The separating can be effected using a laser beam or an FIB beam.

The macrolamella can be thinned using a laser or FIB beam before the processing in the second processing direction starts. In this case, the thinning can be effected before or after the transfer to the receptacle device. It is also conceivable for the thinning to be effected both before and after the transfer.

In order that the volume sample or the macrolamella can be correspondingly processed, it can be desirable for the volume sample or respectively the macrolamella to be tilted relative to the incident particle beams, i.e. to the laser and/or FIB beam. This can be effected by the sample being arranged on a multi-axis sample stage. Such a sample stage usually provides the movement of the sample along at least five axes, namely the spatial axes x, y and z oriented perpendicular to one another, and via two rotation axes. The first rotation axis is generally oriented parallel to the z-axis, while the second rotation axis is oriented parallel to the x-axis or to the y-axis, such that the sample can be rotated, i.e. tilted, about at least one of the rotation axes relative to the optical axes of the microscope system.

Exemplary embodiments of the disclosure are explained below with reference to figures.

For the purpose of explaining the components, therefore, reference is also made to the respectively preceding and succeeding description in its entirety.

DESCRIPTION OF EXEMPLARY EMBODIMENTS

FIGS. 1A-1G schematically show the processing steps during the preparation according to the disclosure of an TEM lamella, which is intended to be obtained by way of example from a parallelepipedal volume sample.

Figure 1A:
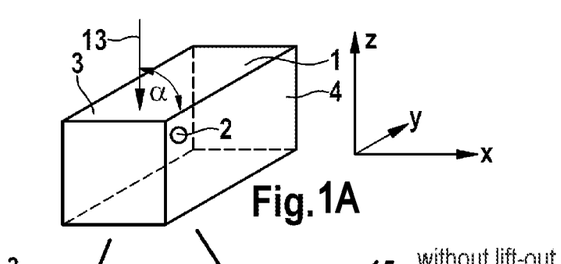
FIGS. 1A-1G schematically show processing steps during preparation of a TEM lamella as an example of a microsample.

However, the shape of the volume sample is not restricted to a parallelepiped. Rather, the volume sample can also have any other shape desired, for example that of a cylinder, sphere, cone, or else an irregular shape.

Firstly, provision is made of a volume sample 1 having a region of interest (ROI) 2 localized in the interior of the volume sample 1 (FIG. 1A). The volume sample 1 has a first side surface 3 and a second side surface 4. The two side surfaces 3, 4 are arranged substantially at right angles to one another.

With the aid of the TEM lamella to be prepared, a region of interest (ROI) 2 is intended to be imaged, analyzed and/or processed in subsequent methods. The ROI 2 can be for example a defect, a specific structure, a material arrangement or conductor track, or else a precipitate, a pore or an impurity phase within the volume sample 1. However, the ROI 2 is situated deep in the interior of the volume sample 1, and so the ROI 2 is not directly accessible for a conventional examination.

It is particularly advantageous if the exact spatial position of the ROI 2 is known, since the x,y,z-coordinates of the ROI 2 in the volume sample 1 are known or are presumed.

The spatial coordinates may be known for example because the way in which the volume sample was produced is known, for example using lithography processes or a known layer construction. By way of example, the volume sample can be a display component, a solar cell or a battery, only the z-coordinate being sharply defined in these cases. A component may also have been embedded in a targeted manner. It is furthermore conceivable for the spatial coordinates to be known on the basis of CAD (computer-aided design) data, for example in the case of electronic components.

Alternatively, the spatial coordinates may have been obtained by way of preceding, nondestructive microscopic examinations, e.g. using computed tomography, x-ray microscopy, lock-in thermography or the like.

Figure 1B:
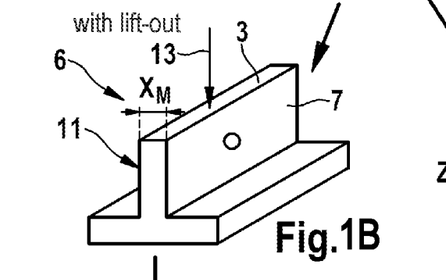
Figure 1C:
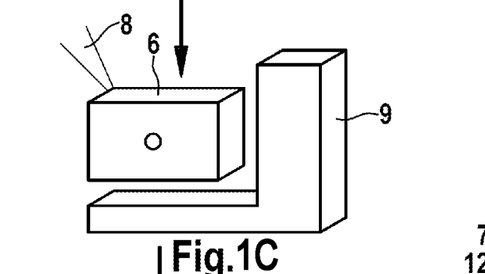

A macrolamella 6 is then produced using laser ablation. For this purpose, at least two trenches 15 are cut into the volume sample 1 using the laser beam 13 in order to expose two cross-sectional surfaces 7, 11. The two cross-sectional surfaces 7, 11 are arranged substantially parallel to one another, such that a parallelepipedal macrolamella 6 arises after the removal of the sample material (FIGS. 1B, 1F). However, it is also conceivable for the cross-sectional surfaces 7, 11 to be inclined with respect to one another and thus to form a macrolamella 6 having a trapezoidal cross section.

The two cross-sectional surfaces 7, 11 are arranged at a defined distance $x_M$ from one another. the distance $x_M$ corresponds to the thickness of the macrolamella 6. It is generally desirable for the spatial position and thickness of the macrolamella 6 to be chosen such that the ROI 2 is localized in the interior of the macrolamella 6. That is to say, therefore, that the position of the two cross-sectional surfaces 7, 11 is chosen such that the ROI 2 is arranged between the two cross-sectional surfaces 7, 11.

In comparison with a conventional sample lamella (e.g. a TEM lamella), the macrolamella is significantly larger, namely by a factor of 10 to 100. It is conceivable for a macrolamella produced by the method according to the disclosure to have for example a length and width of in each case approximately one to two millimeters and a thickness of a few tens of micrometers.

During the removal of sample material with the aid of the laser, it is particularly advantageous if the laser beam 13 is incident substantially perpendicular on the sample surface to be processed, as illustrated in FIG. 1. The incident laser beam 13 and the first side surface 3 of the volume sample 1 therefore form an angle α of approximately 90°.

Figure 1D:
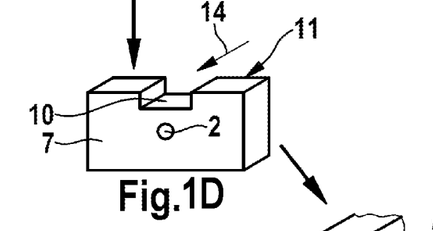
Figure 1E:
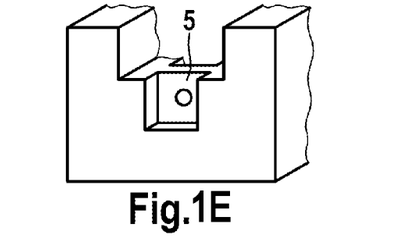
Figure 1F:
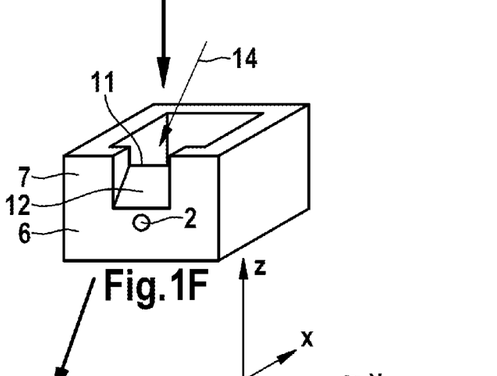
Figure 1G:
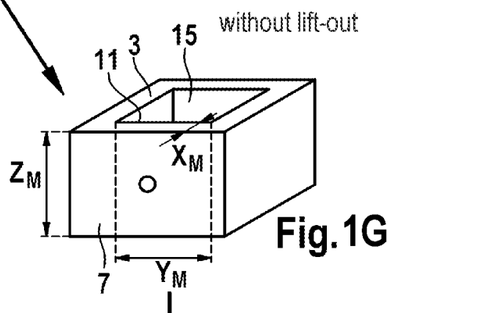

For the further processing, the macrolamella 6 can be detached from the volume sample 1 (FIGS. 1C and 1D), or else it remains connected to the volume sample 1 (FIGS. 1F and 1G).

In the first embodiment of the method (FIG. 1C), a lift-out of the macrolamella 6 is performed. To that end, the macrolamella 6 is separated from the volume sample 1 and transferred to a receptacle device 9 with the aid of a micromanipulator 8 in order to facilitate further handling (FIG. 1C).

For the purpose of separation, the macrolamella 6 is cut in a U-shaped fashion by a laterally incident particle beam, initially only a slight connection remaining between macrolamella and volume sample. The macrolamella is then secured to a pick-up tool (e.g. micromanipulator or microgripper). Finally, the residual connection is separated, such that the macrolamella is now completely detached from the volume sample.

As illustrated in FIG. 1D, one of the exposed cross-sectional surfaces is then processed using a FIB beam 14. Alternatively, a laser beam can also be used for this purpose. It is advantageous if, during this processing step, the processing particle beam 14 is incident substantially perpendicular (i.e. at an angle of 90°) on the cross-sectional surface 11. However, it is also conceivable for the incident particle beam 14 and the cross-sectional surface 11 to form a different angle in the range of 90° to 10°. Particularly preferably, the angle can be 56°, 54° or 52°, such that the cross-sectional surface 11 is processed at one of these angles.

In order to set the processing angle, the macrolamella 6 can be tilted relative to the particle beam. For this purpose, the detached macrolamella 6 (first embodiment of the method) or the volume sample 1 with the not yet detached macrolamella 6 (second embodiment) can be held on a multi-axis stage.

The multi-axis stage (e.g. five-axis stage or six-axis stage) provides the desired degrees of freedom of movement.

In the second embodiment (FIGS. 1F and 1G), initially no lift-out is performed and the macrolamella remains at the volume sample.

If the laser ablation was performed with the aid of laser milling boxes (as described in FIG. 3), it is possible for the edges of the trench structures 15 produced to prevent the cross-sectional surface from being freely accessible (FIG. 1F) to the processing particle beam, which can be an FIB beam 14 or a laser beam.

This can have the effect that, rather than being incident on the cross-sectional surface 11 perpendicular, the FIB beam 14 is incident at a shallower or more acute angle, as indicated in FIG. 1G.

The angle between incident particle beam 14 and cross-sectional surface 11 can be between 30° and 60°, for example. Consequently, the newly produced, second processing surface 12 cannot be oriented at right angles to the cross-sectional surface 11. However, the processing using the FIB beam 14 gives rise to a smooth, planar surface, which facilitates the further processing.

Both embodiments of the method lead to the result that the ROI 2 is now localized in proximity to an outer surface 10, 12 having low roughness.

Finally, a microsample 5 (a TEM lamella in the present example) is now prepared by sample material being removed even using the FIB beam (FIG. 1E).

The microsample 5 includes the ROI 2. The microsample 5 can then be supplied to further processing or analysis methods.

Figure 2A:
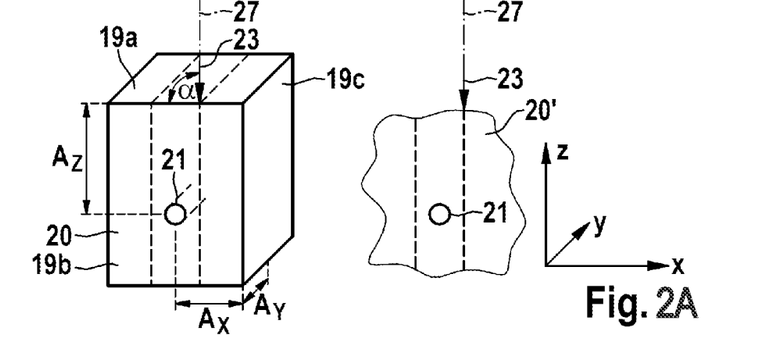
FIGS. 2A-2C schematically show processing steps of a method disclosed herein.
Figure 2B:
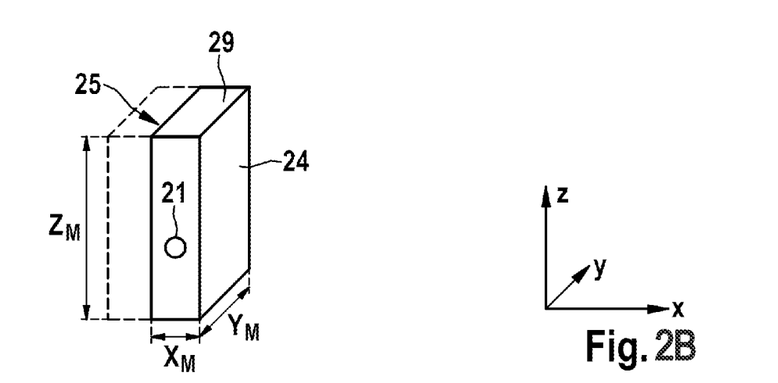
Figure 2C:
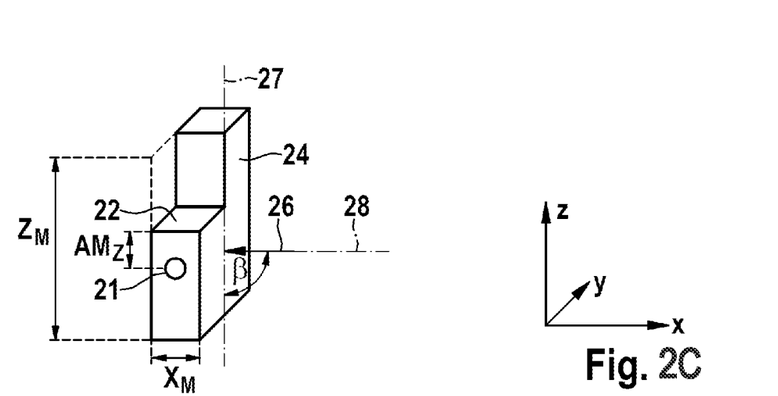

FIGS. 2A-2C elucidate the different processing directions during the method.

FIG. 2A (left-hand side) shows a parallelepipedal volume sample 20 including the ROI 21. It is also conceivable for the volume sample to have a different shape. In this regard, the volume sample 20' can e.g. also be substantially spherical (FIG. 2A, right-hand side).

The ROI 21 is localized in the interior of the volume sample 20, the ROI 21 being at a certain distance from each outer surface 19a, 19b and 19c of the volume sample. These distances $A_z$, $A_y$, and $A_x$ are so great, however, that material removal using a focused ion beam is impracticable.

Material is then removed from the volume sample 20, 20' using a first particle beam 23. In this case, the first particle beam 23 can be incident on the volume sample at an angle α. In order to achieve particularly efficient material removal, the angle α should be approximately 90°.

The first particle beam 23 passes along an axis referred to as first processing direction 27. It is particularly advantageous if the first particle beam 23 is a laser beam.

By way of example, two cross-sectional surfaces 24, 25 situated opposite one another (FIG. 2B) can be produced as a result of a material removal. This gives rise to a macrolamella 29 having the thickness $x_M$, the length $z_M$ and the width $y_M$. Thickness, length and width determine the volume of the macrolamella 29. In this case, it is generally desirable that the volume of the macrolamella encompasses the ROI 2. That is to say, therefore, that the ROI 2 is localized in the interior of the macrolamella 29. In the simplest case, the macrolamella—as just described—is embodied as a flat parallelepiped having an approximately rectangular base surface.

However, the shape of the macrolamella is not restricted to this shape. Rather, the macrolamella can also have other shapes, for example that of a parallelepiped having a square base surface or that of a cylinder having a circular or elliptic base surface. The diameter of the cylinder or the length of the minor axis of the ellipse then corresponds to the lamella thickness $x_M$.

That means that the cross sections do not have to be implemented in a rectilinear fashion, but rather can also be implemented along a circular shape, depending on the intended shape of the macrolamella.

The cross-sectional surface 24 is then processed in a second processing direction 28 (FIG. 2C). For this purpose, a second particle beam 26 impinges on the cross-sectional surface 24. The second particle beam 26 passes along an axis referred to as second is processing direction 28. The second particle beam 26 can be a laser beam or an FIB beam.

The second particle beam 26 and the cross-sectional surface 24 form an angle β that can assume a value of between 10° and 90° inclusive. That means that the first processing direction 27 and the second processing direction 28 are likewise arranged at the angle β with respect to one another. It has proved to be particularly advantageous if the angle β is approximately 90°, since the material removal then proceeds particularly efficiently and rapidly.

During the processing using the second particle beam 26 (i.e. in the second processing direction 28), the sample material can be removed by the sample material being broken down into small particles or by continuous sample regions being separated as a whole from the volume sample.

As illustrated in FIG. 2C, a U-shaped cutout, for example, can be removed using the second particle beam 26. An outer surface 22 arranged in proximity to the ROI 21 is produced as a result. In other words: The distance $AM_z$ between the newly produced outer surface 22 and the ROI 21 is significantly smaller than the distance $A_z$ between the ROI 21 and the outer surface 19 in the unprocessed volume sample 20. Consequently, the ROI 21 has now been made accessible for the further processing.

It is particularly advantageous if the second particle beam 26 is an FIB beam. The removal using the ion beam gives rise to a smooth, clean surface 22. That is to say that the newly produced surface 22 has low roughness, which facilitates the further processing of the sample.

Figure 3A:
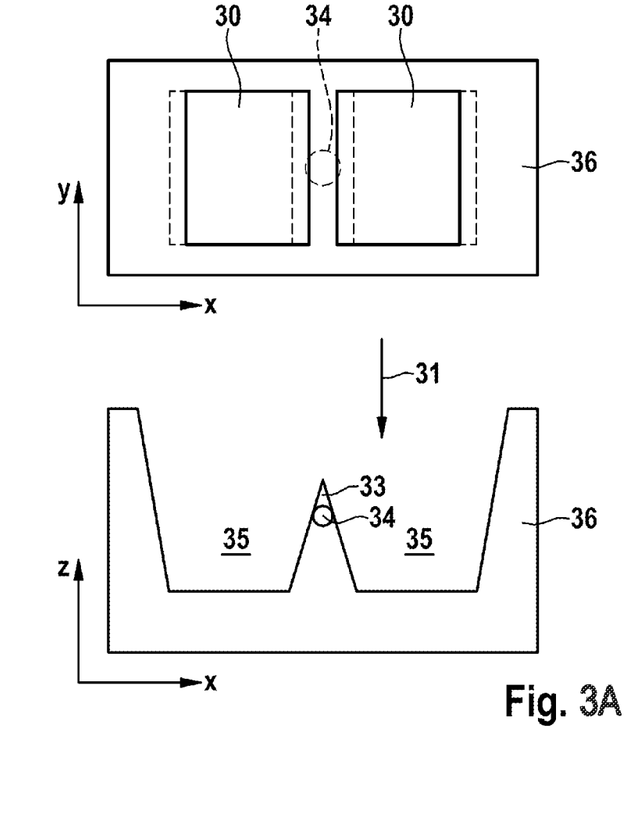
FIGS. 3A-3B schematically show a laser milling of a macrolamella.
Figure 3B:
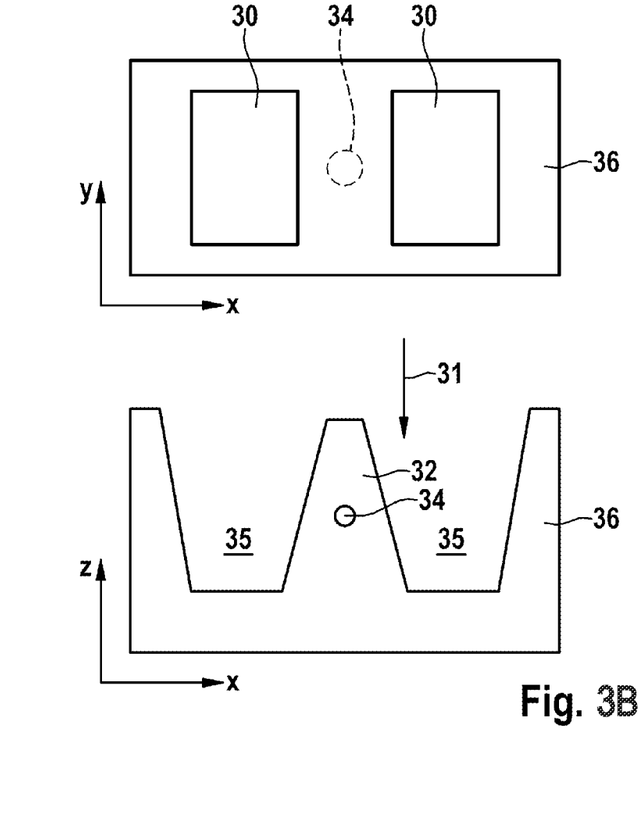

FIGS. 3A-3B show in plan view (top) and cross-sectional view (bottom) how a macrolamella 32 is prepared from a volume sample 36 using laser milling. However, the procedure described is also analogously applicable to milling using a focused ion beam as well.

Milling boxes 30 (laser milling boxes in this example) are usually defined with visual monitoring (light-microscopic or electron-microscopic imaging), the milling boxes defining the sample regions which are intended to be removed using the laser beam. In the plan view, the laser beam is arranged perpendicular to the plane of the drawing.

A so-called trench 35 is produced at a defined region using laser ablation. For the macrolamella preparation, two trenches 35 situated opposite one another and arranged on both sides of the macrolamella 32 are produced using the incident laser beam 31. This gives rise to a first macrolamella 32 having a generally trapezoidal cross section and containing the ROI 34 (FIG. 3A).

As a result of the milling boxes 30 being pushed together or even overlapping, the laser ablation can be controlled in such a way that the macrolamella—as illustrated in FIG. 3B—acquires a wedge shape instead of a trapezoidal shape. This has the advantage that the second macrolamella 33

(FIG. 3B) thus obtained has a smaller length extent (z-direction) and a smaller thickness extent (x-direction) and the ROI 34 is thus situated nearer to the surface of the macrolamella 33 than is the case for the trapezoidal macrolamella 32 from FIG. 3A. This has the further advantage that the subsequent method steps can be concluded in a shorter time since less material has to be removed.

Figure 4:
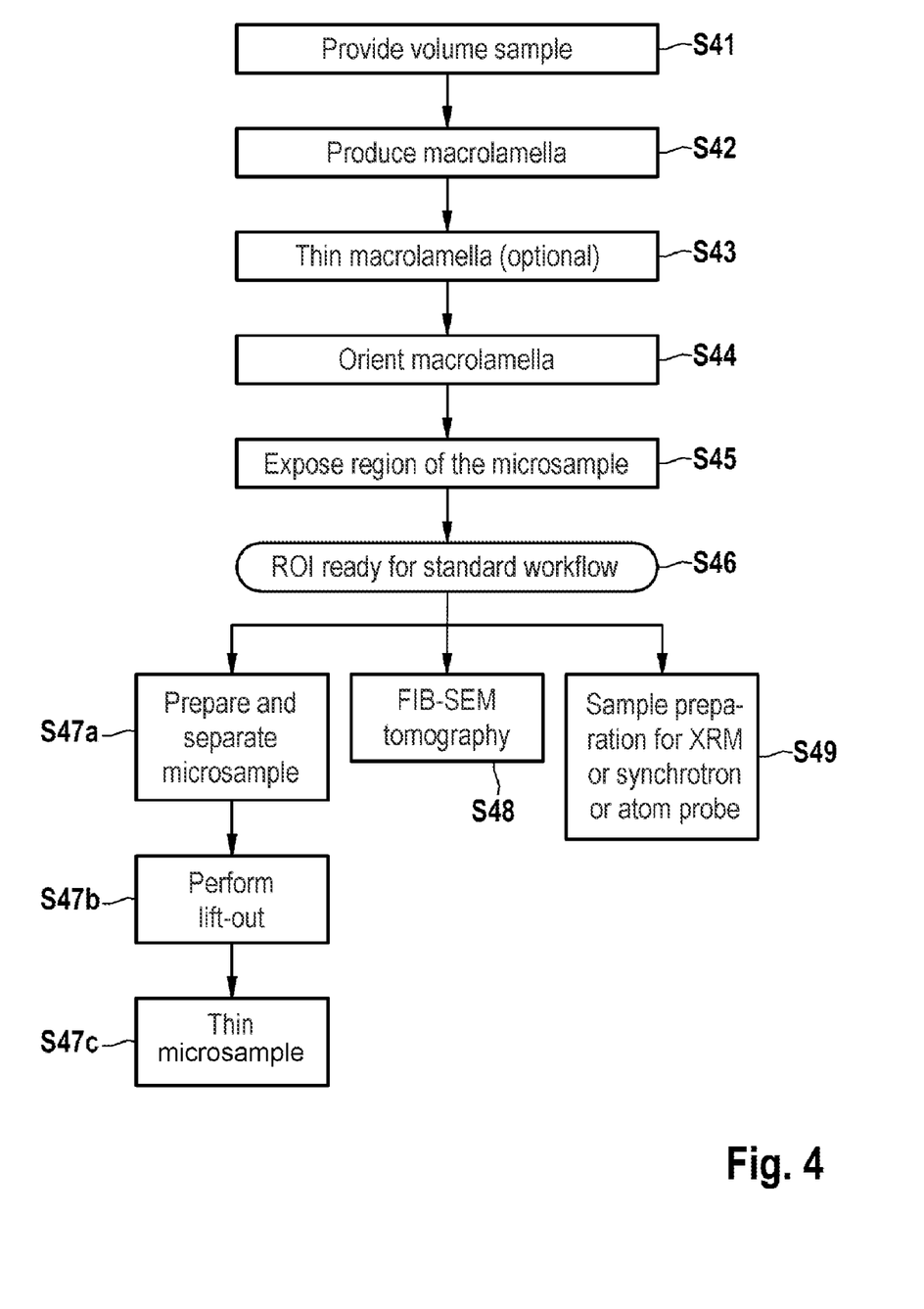
FIG. 4 shows a flow diagram of a method, in which a macrolamella remains connected to the volume sample.

FIG. 4 schematically illustrates the sequence of an embodiment of the method according to the disclosure in which the macrolamella remains connected to the volume sample.

In step S41, a volume sample including a sample region of interest (ROI) is made available. The volume sample is received in the sample chamber of a microscope system, such that it can be processed and/or observed there.

It is particularly advantageous if the microscope system includes a laser device and also a device that enables volume sample, macrolamella and microsample (i.e. the processing stages according to the disclosure of the sample) to be observed and imaged during the method.

Then (step S42) a macrolamella is produced using a laser beam. For this purpose, as illustrated in FIGS. 1 and 2, two more or less parallel cross-sectional surfaces are produced, which form the side surfaces of the macrolamella. Alternatively, instead of the laser beam, an FIB beam (LMIS) or the ion beam of a plasma FIB can be used in this method step.

In an optional step S43, the macrolamella can be thinned. This is done by the thickness of the macrolamella being reduced using FIB or laser removal.

In step S44, the macrolamella is oriented so as to be able to process it from the side, as described for FIGS. 1 and 2. For this purpose, the spatial orientation of the macrolamella relative to the incident particle beams is altered.

Then, in step S45, material around the ROI is removed in order to expose that region which is intended to be contained in the microsample. As described for FIG. 2C, this is done by virtue of the processing particle beam being incident on a cross-sectional surface of the macrolamella at an angle β of 10° to 90° inclusive.

The aim here is to remove sample material in such a way that the ROI 21 is localized directly at or in proximity to an outer surface, such that the ROI 21 becomes accessible for a further processing method.

It is also conceivable to expose a plurality of sample regions of interest (ROIs) for future microsamples.

Finally, in step S46, the ROI 21 is ready for standard methods for further sample preparation. This may be for example the preparation of a TEM lamella that is intended to be analyzed via a TEM or STEM (scanning transmission electron microscope). To that end, in step S47a, the microsample is separated from the macrolamella via the FIB beam. The microsample is then transferred to a suitable receptacle device, such as e.g. a TEM grid, with the aid of a micromanipulator. This can be done in the form of an in-situ or ex-situ lift-out (step S47b). Finally, in step S47c, the TEM lamella can be thinned further until it is sufficiently transparent to electrons.

It is also conceivable for the microsample to be supplied to FIB-SEM tomography (step S48) or, in step S49, to sample preparation for XRM (x-ray microscopy, 3D x-ray microscopy) or synchrotron tomography or atom probe examination.

Furthermore, it is conceivable for the microsample to remain connected to the macrolamella while one of the examination methods mentioned is being carried out, such that the macrolamella is thus used as it were as a holding device for the microsample.

Figure 5:
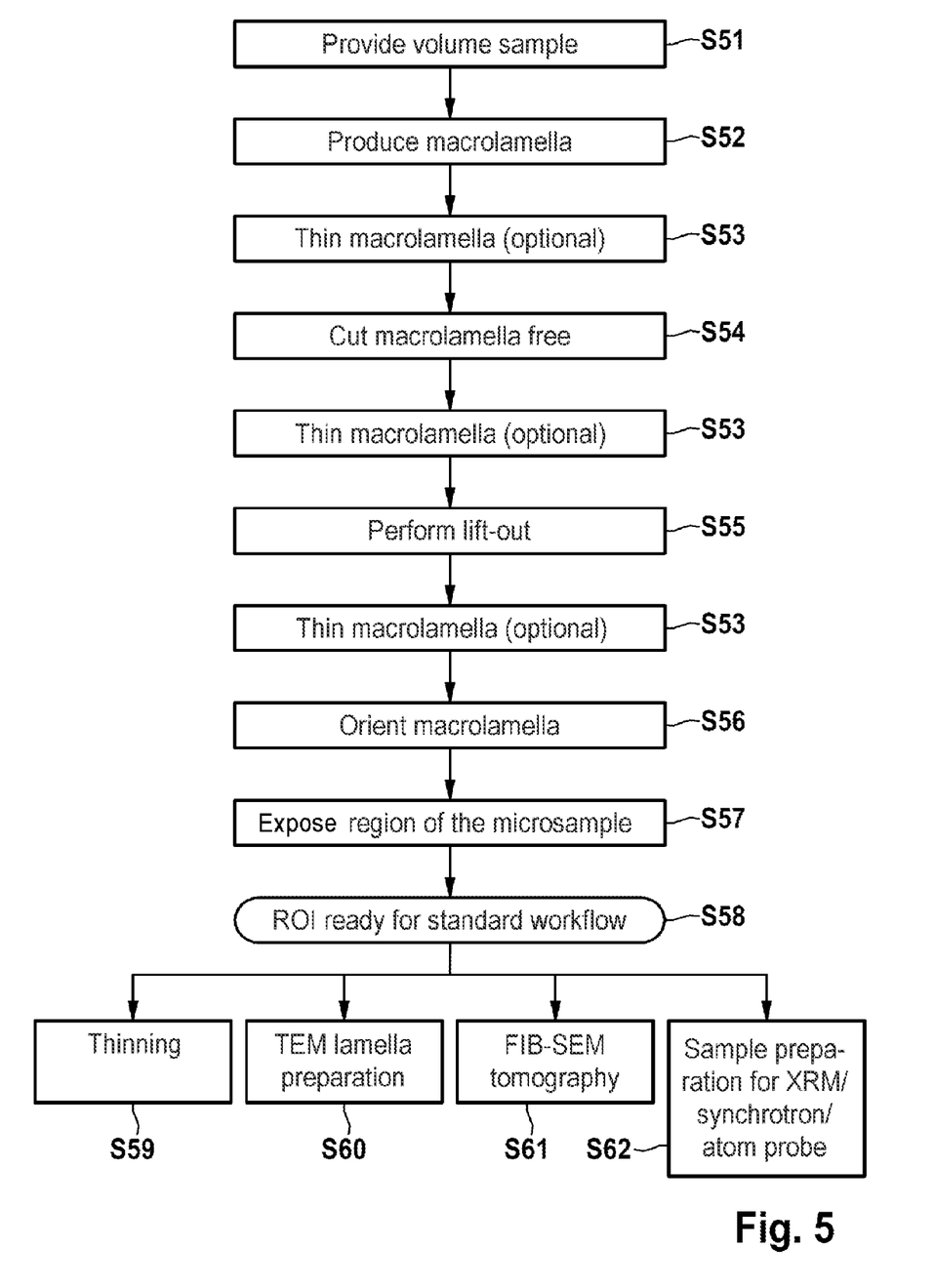
FIG. 5 shows a flow diagram of a method, in which a macrolamella is separated from the volume sample and transferred to a receptacle device.

FIG. 5 schematically shows the sequence of an alternative embodiment of the method according to the disclosure, in which the macrolamella is separated from the volume sample and transferred to a receptacle device.

Firstly, a volume sample is provided (step S51), from which a macrolamella is produced (step S52) as described for FIG. 4 (S41, S42).

Optionally, the macrolamella can be thinned in order to reduce its thickness (step S53).

The macrolamella can then be cut free (S54). This is done by separating the macrolamella via a laser or a FIB beam. To that end, the macrolamella is tilted relative to the particle beam and largely separated from the volume sample.

Further thinning optionally follows (step S53).

In step S55, a lift-out is carried out. For this purpose, the macrolamella is completely separated and transferred to a receptacle device with the aid of a micromanipulator (or a similar tool).

Once again optionally, the isolated macrolamella can be thinned further at this time (step S53).

Then, in step S56, the isolated macrolamella is oriented relative to the second particle beam.

Afterward (step S57) a location for the microsample is exposed by the removal of sample material surrounding the ROI, such that the ROI 21 is arranged directly at an outer surface or in proximity to an outer surface, as illustrated in FIG. 2. It is also conceivable to expose a plurality of sample regions of interest (ROIs) for microsamples.

In step S58, the ROI is then ready for further sample preparation using standard methods. This can be thinning of one or more regions (step S59), one or more lift-out procedures (S60) for the TEM lamella preparation, SEM-FIB tomography (S61) or sample preparation for XRM, synchrotron or atom probe examinations (S62).

Figure 6:
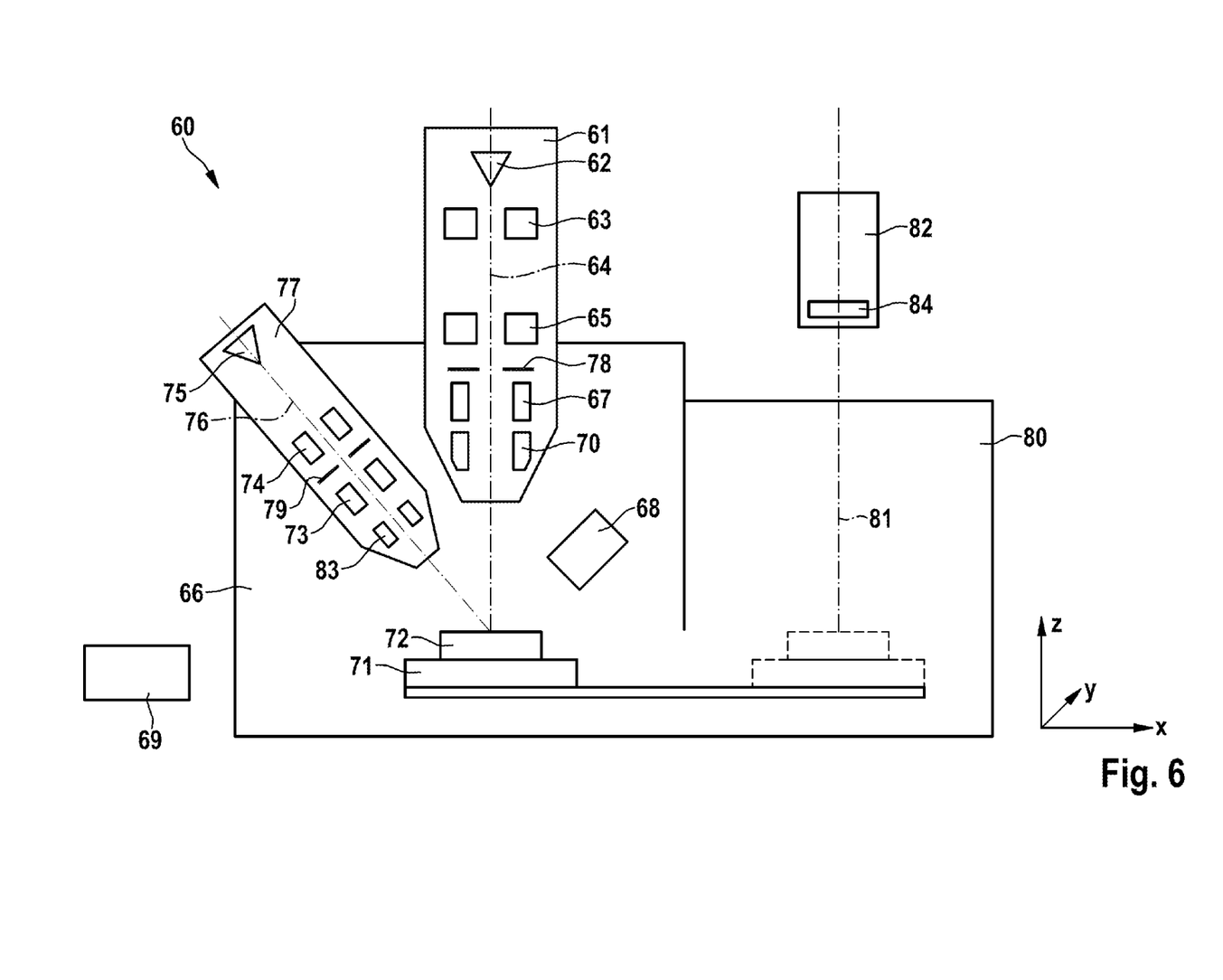
FIG. 6 shows an SEM-FIB combination apparatus with a laser device.

Advantageously, the embodiments of the method according to the disclosure are implemented with a two-beam apparatus (FIB-SEM combination apparatus) 60 with a laser device, the apparatus being illustrated in FIG. 6. Such a microscope system 60 makes available with laser and FIB two processing particle beams, and also a further particle beam (electron beam), which can be used for imaging.

The microscope system 60 firstly includes two particle beam columns, specifically an electron beam column 61 for generating an electron beam and an ion beam column 77 for generating an ion beam. Both particle beams are directed onto the processing location on the sample 72 to be processed (i.e. volume sample, macrolamella or microsample), the location advantageously being situated at the coincidence point of both particle beams.

Usually, for this purpose, the sample 72 is received on a sample stage 71 and is situated in the sample chamber 66 of the microscope system 60, in which chamber vacuum conditions prevail.

The sample stage 71 is advantageously embodied as a multi-axis sample stage having at least five movement axes. That means that the sample receptacle can be moved in the x-, y- and z-directions—i.e. in three mutually perpendicular spatial directions—and can be rotated about a tilt axis and a rotation axis. Optionally, further movement axes can be present.

The rotation axis can be oriented perpendicular to one of the spatial directions, for example. The rotation about the tilt axis, which extends perpendicular to a plane spanned by the optical axes 64, 76 (i.e. perpendicular to the plane of the drawing), makes it possible that the surface of the sample 72 which is intended to be irradiated by charged particles can adopt different adjustable angles with respect to the optical axes 64, 76.

Consequently, five degrees of freedom of movement, specifically three translational and two rotational degrees of freedom of movement, are provided for the received sample 72. It is conceivable for further degrees of freedom of movement to be made available via further axes or additional devices such as sample holder, manipulator and/or gripper (not illustrated).

During the operation of the microscope system 60, primary electrons are generated in the electron source 62, the primary electrons being accelerated along the optical axis 64 of the electron beam column 61, focused, parallelized or scattered by the condenser lens systems 63, 65 and trimmed by at least one aperture stop 78. Moreover, the electron beam column 61 includes a deflection system 67, which enables the primary electron beam to be guided over the sample 72 in raster-type fashion, and also an objective lens 70, with the aid of which the electron beam can be focused onto the sample.

The microscope system 60 furthermore includes at least one detector 68 for detecting interaction products of the interaction of the electrons and/or ions with the sample 72.

The microscope system 60 additionally includes an ion beam column 77 with an ion source 75, a deflection system 74, an aperture stop 79 and a lens system 73. The ion source 75 can be a liquid metal ion source (LMIS), for example, which is operated with a gallium ion source, for example. Alternatively, it is also conceivable for the ion source 75 to be embodied as a plasma ion source (e.g. with xenon).

The ions generated in the ion source 75 are accelerated along the optical axis 76 of the ion beam column 77 and focused, the ions being focused onto the sample 72 using an objective lens 83. The ions incident on the sample can be used to remove material of the sample 72 and/or to image the sample 72.

With the use of a plasma ion source, it is particularly advantageous that different beam currents can be set for the generated ion beams (plasma FIB), which make it possible on the one hand to remove large sample volumes in a short time, and on the other hand to perform fine processing with smaller beam currents. Accordingly, it is conceivable to use a first ion beam having a first beam current for the coarse processing (i.e. removal of volumes which are larger than approximately 1000 µm³). This has the advantage that the laser device 80 is not necessarily required when a plasma FIB is used.

Furthermore, a second ion beam having a second beam current can be generated by the plasma ion source. The second beam current should be smaller than the first beam current, such that the second ion beam can be used for the fine processing (i.e. removal of volumes which are smaller than approximately 1000 µm³).

Furthermore, the microscope system 60 can include a laser device 80 with a pulsed laser. Preferably, the laser device 80 is embodied as a femto-, pico- or nanosecond laser. The laser beam generated in a laser source 82 can be directed onto the sample 72 along the optical axis 81 of the laser device 80 and can be focused with the aid of an objective 84 in order to remove sample material using laser ablation. The optical axis 81 can be oriented parallel to another optical axis of the microscope system 60, for example parallel to the optical axis of the electron beam column 64.

In contrast to the illustration shown in FIG. 6, it is also conceivable, in the case of the microscope system, for the laser device to be arranged in the sample chamber 66. In this regard, the laser beam can be oriented toward a common coincidence point of the electron beam and the ion beam, which facilitates the processing and imaging of a sample.

Furthermore, the microscope system 60 advantageously includes an evaluation and control unit 69. The evaluation and control unit 69 can execute a sequence of control commands included in a computer program product. The execution of the control commands causes the microscope system 60 to implement an embodiment of the method according to the disclosure.

LIST OF REFERENCE SIGNS

1 Volume sample
2 Sample region of interest (ROI)
3 First side surface
4 Second side surface
5 Microsample
6 Macrolamella
7 First cross-sectional surface
8 Micromanipulator/gripper
9 Receptacle device
10 First processing surface
11 Second cross-sectional surface
12 Second processing surface (inclined relative to the first cross-sectional surface)
13 Laser beam
14 FIB beam
15 Trench
$x_M$ Thickness of the macrolamella
$z_M$ Length of the macrolamella
$y_M$ Width of the macrolamella
19a First outer surface
19b Second outer surface
19c Third outer surface
20 Volume sample (parallelepipedal)
20' Volume sample (arbitrary shape)
21 Sample region of interest (ROI)
22 Outer surface
23 First particle beam
24 First cross-sectional surface
25 Second cross-sectional surface
26 Second particle beam
27 First processing direction
28 Second processing direction
29 Macrolamella
α Angle between first processing direction and surface of the volume sample
β Angle between first and second processing directions
$A_x$ Distance between ROI and third outer surface 19c
$A_y$ Distance between ROI and second outer surface 19b
$A_z$ Distance between ROI and first outer surface 19a
$AM_z$ Distance between ROI and newly produced outer surface 22
30 Milling box
31 Laser beam
32 First macrolamella
33 Second macrolamella
34 Sample region of interest (ROI)
35 Trench
36 Volume sample
S41 Provide volume sample
S42 Produce macrolamella
S43 Thin macrolamella
S44 Orient macrolamella
S45 Expose region of the microsample S46 ROI ready for standard workflow
S47a Prepare and separate microsample(s)
S47b Perform lift-out
S47c Thin microsample
S48 SEM-FIB tomography
S49 Sample preparation for XRM/synchrotron/atom probe examination
S51 Provide volume sample
S52 Produce macrolamella
S53 Thin macrolamella (optional)
S54 Cut macrolamella free
S55 Perform lift-out
S56 Orient macrolamella
S57 Expose region of the microsample
S58 ROI ready for standard workflow
S59 Thinning
S60 TEM lamella preparation
S61 SEM-FIB tomography
S62 Sample preparation for XRM, synchrotron or atom probe examination
60 Microscope system
61 Electron beam column
62 Electron source
63 First condenser lens system
64 Optical axis of the electron beam column
65 Second condenser lens system
66 Sample chamber
67 Deflection system
68 Detector
69 Evaluation and control unit
70 Objective lens
71 Sample stage
72 Sample
73 Lens system
74 Deflection system
75 Ion source
76 Optical axis of the ion beam column
77 Ion beam column
78 Aperture stop (electron beam column)
79 Aperture stop (ion beam column)
80 Laser device
81 Optical axis of the laser device
82 Laser source
83 Objective lens (FIB)
84 Objective (laser)

What is claimed is:

1. A method, comprising:
a) providing a sample comprising a region of interest;
b) producing a macrolamella comprising the region of interest by removing material from the sample using a first particle beam so that first and second cross-sectional surfaces of the sample are exposed, the first and second cross-sectional surfaces being opposite one another and spaced apart from one another, and the region of interest of the sample being between the first and second cross-sectional surfaces;
c) orienting the macrolamella relative to a processing particle beam so that the processing particle beam and a selected cross-sectional surface form an angle of from 10° to 90° with respect to one another, the processing particle beam being selected from the group consisting of the first particle beam and a second particle beam, and the selected cross-sectional surface being selected from the group consisting of the first cross-sectional surface and the second cross-sectional surface; and
d) producing a microsample comprising the region of interest by removing material from the macrolamella using the processing particle beam,
wherein, during b), only the first particle beam is used to remove material from the sample to produce the macrolamella.

2. The method of claim 1, wherein:
the method is performed using a microscope system in which the sample is present; and
one of the following holds:
i) the microscope system comprises a first device configured to provide the first particle beam and a second device configured to provide the second particle beam, and the sample is in the microscope system; and
ii) the microscope system comprises a device configured to provide the first and second particle beams.

3. The method of claim 2, wherein i) holds, the first device comprises a laser configured to provide the first particle beam, and the second device comprises a focused ion beam device configured to provide the second particle beam.

4. The method of claim 2, wherein ii) holds, and the device comprises a plasma focused ion beam device.

5. The method of claim 2, wherein the microscope system further comprises a device configured to image the sample.

6. The method of claim 2, wherein the microscope system further comprises:
a device configured to generate a primary electron beam to interact with the sample to provide interaction products; and
a detector configured to detect the interaction products so that an image of the sample is generatable.

7. The method of claim 1, further comprising imaging the sample.

8. The method of claim 1, further comprising:
exposing the sample to a primary electron beam to generate interaction products due to the interaction of the primary electrons and sample material; and
detecting the interaction products to provide an image of the sample.

9. The method of claim 1, wherein the first particle beam comprises a laser beam, and the second particle beam comprises a focused ion beam.

10. The method of claim 1, wherein:
the first particle beam comprises a focused ion beam having a first beam current;
the second particle beam comprises a focused ion beam having a second beam current; and
the first beam current is greater than the second beam current.

11. The method of claim 1, further comprising:
separating the macrolamella from the sample; and
before b), transferring the separated macrolamella to a receptacle device.

12. The method of claim 11, further comprising using a beam selected from the group consisting of a laser beam and a focused ion beam to separate the macrolamella from the sample.

13. The method of claim 1, further comprising using a particle beam selected from the group consisting of the first particle beam and the second particle beam to thin the macrolamella.

14. The method as claimed in claim 1, further comprising using a focused ion beam to thin the macrolamella.

15. The method of claim 1, further comprising, after c), exposing the sample to a process selected from the group consisting of transmission electron microscopy, FIB-SEM tomography, 3D x-ray microscopy, synchrotron examination and atom probe examination.

16. One or more machine-readable hardware storage devices comprising instructions that are executable by one or more processing devices to perform operations comprising the method of claim 1.

17. The method of claim 1, wherein the angle is from 30° to 90°.

18. A system comprising:
one or more processing devices; and
one or more machine-readable hardware storage devices comprising instructions that are executable by the one or more processing devices to perform operations comprising the method of claim 1.

19. The system of claim 18, wherein:
the system comprises a microscope system in which the sample is present; and
one of the following holds:
   i) the microscope system comprises a first device configured to provide the first particle beam and a second device configured to provide the second particle beam, and the sample is in the microscope system; and
   ii) the microscope system comprises a device configured to provide the first and second particle beams.

20. The method of claim 1, wherein, during d), only the processing particle beam is used to remove material from the macrolamella to produce the microsample.

* * * * *

UNITED STATES PATENT AND TRADEMARK OFFICE
CERTIFICATE OF CORRECTION

| | |
|---|---|
| PATENT NO. | : 11,935,723 B2 |
| APPLICATION NO. | : 17/522087 |
| DATED | : March 19, 2024 |
| INVENTOR(S) | : Fabian Perez Willard and Tobias Volkenandt |

It is certified that error appears in the above-identified patent and that said Letters Patent is hereby corrected as shown below:

In the Specification

Column 3, Line 39, after "a" delete "is".

Column 4, Line 4, after "be" delete "to".

Column 4, Line 48, after "are" delete "is".

Column 8, Line 13, delete "the" and insert -- The --.

Column 10, Line 16, after "as second" delete "is".

Signed and Sealed this
Fourth Day of June, 2024

Katherine Kelly Vidal
*Director of the United States Patent and Trademark Office*